United States Patent [19]

Fromson

[11] 4,021,592

[45] May 3, 1977

[54] PROCESS OF MAKING ELECTROPLATED ANODIZED ALUMINUM ARTICLES AND ELECTROLESS PLATING

[76] Inventor: Howard A. Fromson, Rogues Ridge Road, Weston, Conn. 06880

[22] Filed: Oct. 15, 1975

[21] Appl. No.: 622,544

Related U.S. Application Data

[63] Continuation of Ser. No. 449,162, March 7, 1974, Pat. No. 3,929,594, which is a continuation-in-part of Ser. No. 361,720, May 18, 1973, Pat. No. 3,865,700.

[52] U.S. Cl. .............................. 428/209; 204/15; 204/17; 204/38 A; 96/33; 252/461; 252/472; 427/304; 427/437; 427/405; 427/271; 427/305; 427/306; 156/237; 428/210

[51] Int. Cl.² .......................................... C25D 5/44

[58] Field of Search ............. 204/42, 15, 17, 38 A, 204/35 N; 101/456, 458, 459; 427/437, 304, 305, 306; 96/33; 262/461, 472; 428/209, 210

[56] References Cited

UNITED STATES PATENTS

| | | | |
|---|---|---|---|
| 1,947,981 | 2/1934 | Fischer | 204/42 |
| 2,036,962 | 4/1936 | Fischer | 204/42 |
| 2,798,037 | 7/1957 | Robinson | 204/42 |
| 2,898,490 | 8/1959 | Damon | 204/42 |
| 2,930,951 | 3/1960 | Burger et al. | 204/42 |
| 3,099,609 | 7/1963 | Katayose | 204/42 |
| 3,865,700 | 2/1975 | Fromson | 204/28 |
| 3,929,594 | 12/1975 | Fromson | 204/38 A X |

OTHER PUBLICATIONS

Kissin, Finishing of Aluminum, Reinhold Pub. Corp., pp. 172, 173.

*Primary Examiner*—Ralph S. Kendall
*Attorney, Agent, or Firm*—Burgess, Dinklage & Sprung

[57] ABSTRACT

An article having an aluminum substrate, an unsealed, porous anodic oxide layer thereon and electrolytically deposited, randomly distributed discrete metal islands having a root portion anchored in one or more pores of the oxide layer. The metal islands extend from the root portion above the surface of the oxide layer in a bulbous, undercut configuration.

A process for treating aluminum is also disclosed and includes the steps of electrolytically anodizing aluminum surfaced articles to form an unsealed, porous anodic oxide layer thereon followed by electrolytically depositing randomly distributed discrete metal islands in the pores of the oxide layer and extending above the surface thereof in the bulbous, undercut configuration.

22 Claims, 14 Drawing Figures

Cr    300 X    30 SEC.

Cr    1000 X    30 SEC.

Cr    3000 X    30 SEC.

Cr    300 X    150 SEC.

Cr    1000 X    150 SEC.

Cr    3000 X    150 SEC.

Cu    300 X    30 SEC.

Cu    1000 X    30 SEC.

Cu    3000 X    30 SEC.

FIG. 10.     FIG. 11.     FIG. 12.
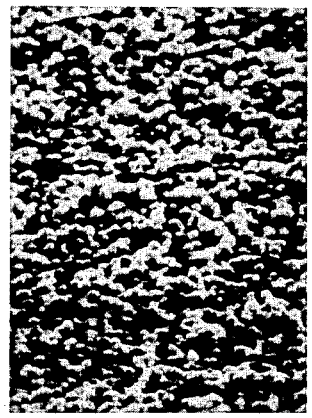
Cu   300X   60 SEC.
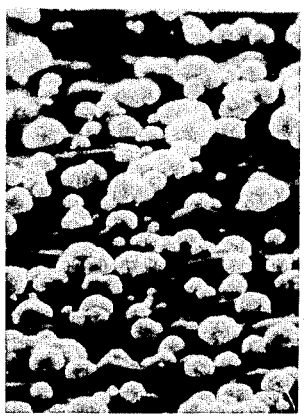
Cu   1000X   60 SEC.
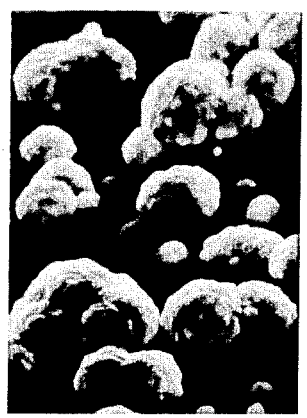
Cu   3000X   60 SEC.
FIG. 13.
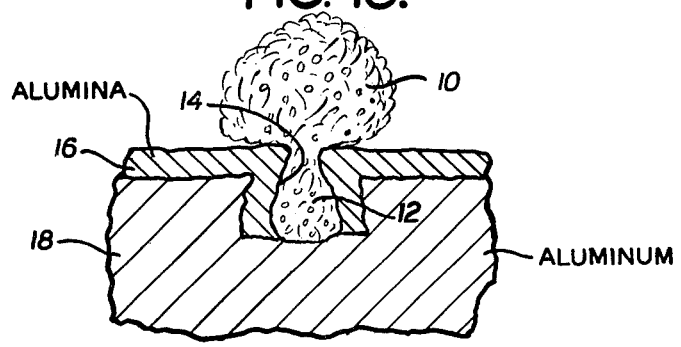
FIG. 14.
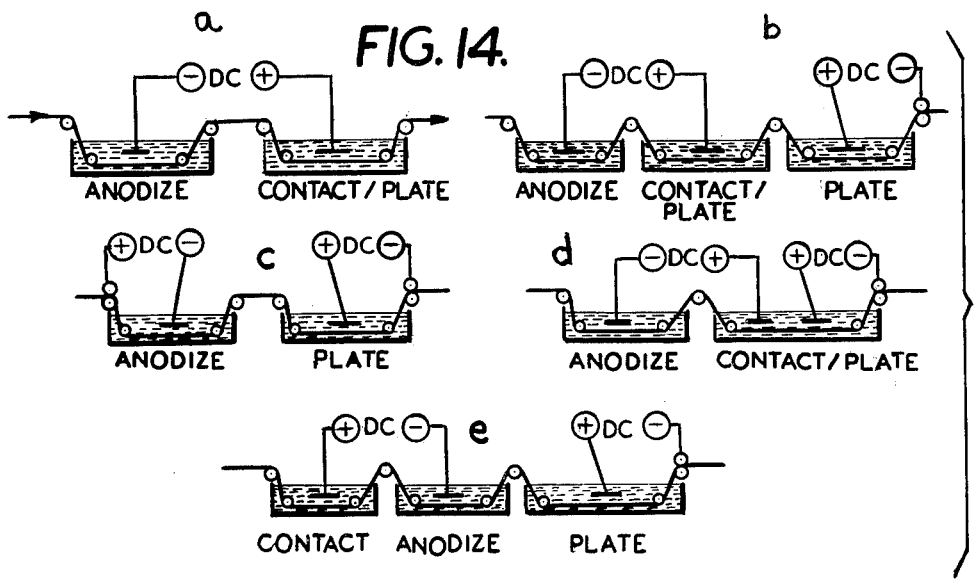

PROCESS OF MAKING ELECTROPLATED ANODIZED ALUMINUM ARTICLES AND ELECTROLESS PLATING

This is a continuation of application Ser. No. 449,162, filed Mar. 7, 1974, now U.S. Pat. No. 3,929,594 which is a continuation-in-part of co-pending application Ser. No. 361,720 filed May 18, 1973 now U.S. Pat. No. 3,865,700.

BACKGROUND

This invention relates to a process for treating aluminum batchwise or continuously to form an unsealed, porous anodic oxide layer thereon with discrete metal islands electrolytically deposited in the pores of the oxide layer and extending above the surface thereof in a bulbous, undercut configuration. This invention also relates to an article having an aluminum substrate, an unsealed, porous anodic oxide layer and randomly distributed discrete metal islands anchored in the pores of the oxide layer.

The art of surface treating and finishing of aluminum and its alloys is a complex and well developed art as evidenced by the texts of S. Wernick entitled *Surface Treatment and Finishing of Aluminium and Its Alloys*, Robert Draper Ltd., Teddington, England (1956) and G. H. Kissin Finishing of Aluminum, Reinhold Publishing Corporation, New York. It is acknowledged that electroplating on aluminum requires extraordinary treatments to gain the necessary adhesion. The most familiar techniques for plating on aluminum are the zincating and anodizing processes. In the latter case which involves the plating over an anodic oxide layer formed on an aluminum substrate, the art has directed its efforts towards producing continuous electroplated coatings.

It has now been discovered that a discontinuous electroplated metal surface can be applied to anodized aluminum in an efficient and economical manner. This discontinuous electroplated surface provides articles useful per se, for example as composite catalyst bodies, and because the discontinuous electroplated surfaces tenaciously adheres and interlocks with the anodic oxide layer on the aluminum, it is now possible to directly apply coatings and laminates to the aluminum article thereby forming a tenacious, mechanically interlocked bond to the coating.

SUMMARY

Articles according to the present invention, have an aluminum substrate, an unsealed porous anodic oxide layer on the substrate and electrolytically deposited, randomly distributed discrete metal islands having a root portion anchored in one or more pores of the oxide layer, said islands extending from the root portion above the surface of the oxide layer in a bulbous, undercut configuration.

The process of the invention for treating aluminum, batchwise or continuously, includes the steps of: electrolytically anodizing aluminum surfaced articles on web to form an unsealed, porous anodic oxide layer thereon and thereafter electrolytically depositing randomly distributed discrete metal islands having a root portion anchored in one or more pores of the oxide layer, said islands extending from the root portion above the surface of the oxide layer in a bulbous, undercut configuration.

In a preferred embodiment aluminum or aluminum surfaced webs are continuously electrolytically anodized and plated by continuously passing the web through an anodizing cell having therein a cathode connected to a source of direct current, continuously passing the web from the anodizing cell into a cathodic contact cell having therein a platable metal anode connected to the source of direct current, introducing anodizing direct current into the web in the contact cell, the web having an anodized oxide coating formed thereon in the anodizing cell before entering the contact cell, and depositing the platable metal on or in the oxide coating in the contact cell. Apparatus for carrying out this preferred process includes anodizing cell means containing a cathode connected to a source of direct current, cathodic contact cell means containing an anode connected to the same source of direct current, and means for continuously passing an aluminum web, first through the anodizing cell means and then through the contact cell means, the anodizing direct current entering the web in the contact cell means with an anodized oxide coating formed thereon, the anode of the contact cell means being of a platable metal and the contact cell means being adapted to deposit the platable metal on or in said oxide coating.

DESCRIPTION OF THE DRAWINGS

The present invention will be more fully understood from the following description taken in conjunction with the accompanying drawings wherein:

FIG. 7–12 are photomicrographs showing copper electrolytically deposited in the pores of an unsealed anodized aluminum surface in the form of metal islands having a bulbous, undercut configuration;

FIG. 13 is an enlarged cross-sectional view depicting a metal island anchored in a pore of the anodic oxide layer and extending above the surface thereof in a bulbous, undercut configuration; and FIG. 14a–e are diagrammatic representations showing several ways in which aluminum web can be continuously anodized and plated according to the present invention.

DESCRIPTION

Figure 1:
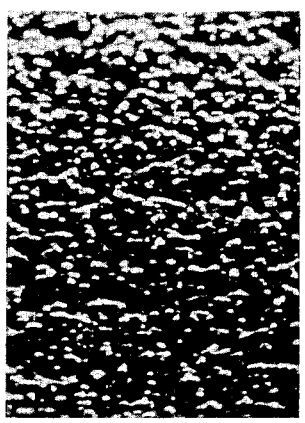
FIG. 1–6 are photomicrographs showing chromium electrolytically deposited in the pores of an unsealed anodized aluminum surface in the form of metal islands having a bulbous, undercut configuration.
Figure 2:
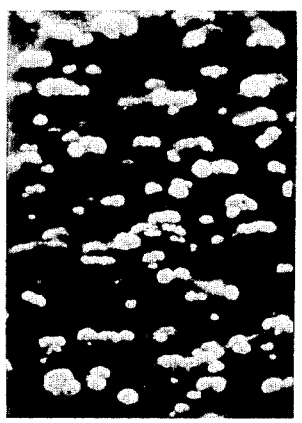
Figure 3:
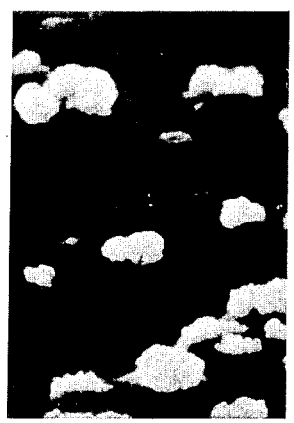
Figure 4:
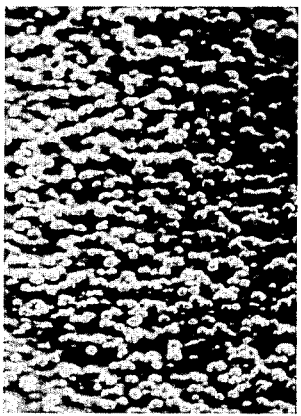
Figure 5:
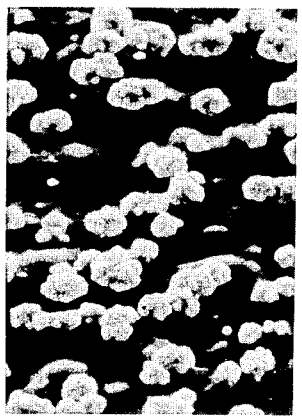
Figure 6:
Figure 7:
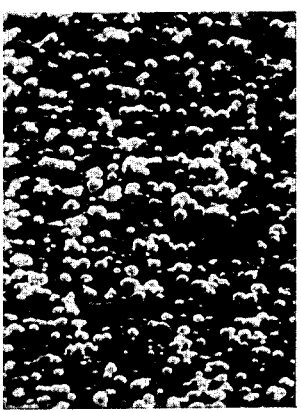
Figure 8:
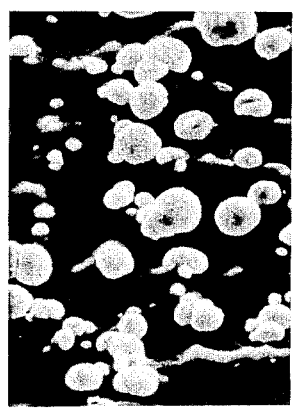
Figure 9:

Referring now to the drawing and in particular to FIG. 13, the aluminum article of the invention is shown to include an aluminum substrate 18 with an unsealed, porous anodic oxide layer 6 thereon. Electrolytically deposited metal islands have a root portion 12 anchored in one or more pores 14 of the oxide layer 16. The islands extend from the root portion 12 above the surface of the oxide layer 16 in a bulbous, undercut configuration 10. This bulbous, undercut configuration is demonstrated by FIGS. 1–12 which are photomicrographs obtained using an electron microscope at magnifications of 300, 1,000 and 3,000. Chromium was electrolytically deposited in these examples over a period of time of 30 seconds (FIGS. 1–3) and 150 seconds (FIGS. 4–6). Copper was electrolytically deposited over a period of time of 30 seconds (FIGS. 7–9) and 60 seconds (FIGS. 10–15). In each instance the chromium and the copper is deposited in a randomly distributed fashion in the form of discrete metal islands each of which is anchored in one or more pores of the anodic oxide layer and extends above the surface thereof in a bulbous, undercut configuration.

A unique feature of the present invention is the electrolytic deposition of metal islands which are discrete one from the other and each of which has a bulbous, undercut configuration. The present invention takes advantage of this phenomenon by recognizing that the discrete metal islands are firmly anchored in the pores of the anodic oxide layer and the portion extending above the surface thereof generally has a diameter larger than the anchoring root portion in the pores of the oxide layer.

Virtually any platable metal can be applied to an anodized aluminum article to form a discontinuous electroplated surface according to the present invention. Examples of suitable metals include copper, tin, zinc, silver, nickel, gold, rhodium, chromium, alloys and mixtures of the foregoing and the like.

The aluminum article of the invention having an anodized surface and a discontinuous electroplated surface can be made using conventional anodizizng and plating techniques but is preferably made using the continuous process of the invention. A key factor in the plating operation is the plating time which should be selected depending on the use of the aluminum article (i.e., the desired density of discrete metal articles). However, the plating time should not be so long as to cause briding or contact between adjacent metal islands.

The aluminum article of the invention is preferably anodized and plated in a continuous fashion utilizing the process of the invention and/or the process disclosed in co-pending application Ser. No. 361,720 filed May 18, 1973 now Pat. No. 3865700.

According to the process disclosed in said co-pending application, aluminum is continuously electrolytically anodized and plated by introducing anodizing direct current into the aluminum in a cathodic contact cell containing a platable metal, the aluminum having an anodized oxide coating formed thereon before entering the cell by the action of the direct current introduced in the contact cell itself. While in the contact cell the platable metal is deposited in the pores of the preformed oxide coating in the form of metal islands as described herein.

Stated in different terms, aluminum web is continuously electrolytically anodized and plated by continuously passing the web through an anodizing cell having therein a cathode connected to a source of direct current, continuously passing the web from the anodizing cell into a cathodic contact cell having therein a platable metal anode connected to the same source of direct current. Anodizing direct current is introduced into the web in the contact cell and the web has an anodized oxide coating formed thereon in the anodizing cell before entering the contact cell. While in the contact cell the platable metal is deposited in the pores of the oxide coating in the form of discrete metal islands as described herein.

In the process disclosed in co-pending application Ser. No. 361,720, the aluminum web entering a cathodic contact cell already has an anodized oxide coating formed thereon before entering the cell. This makes it possible to use a platable metal for the anode of the contact cell such as a copper, nickel, zinc or the like anode. In this manner, direct current introduced into the aluminum web in the contact cell for forming an anodized oxide coating thereon before the web enters the cell, can also be used to deposit platable metals froam the anode in the pores of the anodized oxide coating formed on the aluminum web before it enters the contact cell. In effect, direct current from one source is utilized for carrying out two operations, namely forming an oxide coating on the aluminum web before it enters the contact cell and depositing platable metals on the preformed oxide coating while the aluminum web passes through the contact cell. Because the process in the contact cell deposits a discontinuous plated surface in the form of metal islands as described herein, it becomes possible to use conventional continuous electroplating techniques to enlarge the size and/or density of the discrete metal articles forming the discontinuous electroplated surface.

FIG. 14 of the drawing shows several embodiments of the process of the invention for continuously anodizing and plating aluminum web. FIG. 14a illustrates process and apparatus described in co-pending application Ser. No. 361,720. Here, an anodizing cell is followed by a contact cell and each is provided with suitable rollers to guide an aluminum web therethrough in the direction indicated by the arrows. Each cell includes a tank which contains an electrolyte. The anodizing cell has a cathode connected to a source of direct current as shown. The contact cell has an anode which is connected to the same source of direct current. The aluminum web continually passes through the anodizing cell and then the contact cell as illustrated. Anodizing direct current is introduced into the web in the contact cell. The web thus has an anodized oxide coating formed thereon in the anodizing cell before entering the contact cell through the action of the direct current introduced into the web in the contact cell. This same current also causes platable metal from the anode in the contact cell to be deposited in the pores of the preformed oxide coating in the form of discontinuous discrete metal islands having a bulbous undercut configuration as described herein.

As is well known in the art, an aluminum web can be cleaned, de-greased or otherwise pretreated (chemically and/or mechanically) using conventional techniques before it is anodized and after being plated it can be sealed, dyed or otherwise post-treated using conventional aluminum surface finishing techniques. The web is generally passed through a continuous treating operation according to the invention utilizing conventional winding and feeding equipment.

In FIG. 14b an aluminum web is anodized by introducing anodizing direct current into the aluminum in the cathodic contact cell which causes the formation of an anodized oxide coating on the web before it enters the contact cell. The anodized web then passes through the plating bath and the plating current is introduced into the web via a contact roll positioned to contact the web after it leaves the plating cell. In this particular embodiment the process is preferably started up by first threading bare aluminum web through the three treatment cells and is placed in contact with the contact roll at the exit of the plating cell. The plating current is first switched on which results in some plating on the bare aluminum web. Once the anodizing operation is initiated, the web entering the plating bath is anodized and is plated therein with a discontinuous surface in the form of the discrete metal islands as described herein. This start up procedure is required when plating contact is made via a contact roll and plating is done in a separate plating cell, e.g. in the process of FIGS. 14c and *e* (described below). It is preferred for the process of FIGS. 14*b* and *d*.

In FIG. 14*c*, the aluminum web is anodized in an anodizing cell and the web is in contact with an electrically conductive roll prior to entering the anodizing cell. The anodized web then passes into a plating cell where the web is in contact with an electrically conductive roll after leaving the plating cell. The contact roll preceding the anodizing cell introduces the anodizing current and the contact roll following the plating cell introduces the plating current to the web.

FIG. 14*d* is similar to FIG. 14*b* wherein the contact cell and the plating cell are combined into the same cell.

In FIG. 14*e* the aluminum web is anodized by passing first through a contact cell and then through an anodizing cell. The anodized web is then passed through a plating cell and plating current is introduced to the web via an electrically conductive contact roll in contact with the web after it leaves the plating cell. The process illustrated by FIG. 14*e* is initiated with bare aluminum in the same manner as described for the embodiment shown in FIG. 14*b*.

The present invention makes it possible to prepare coated articles by applying a coating to the oxide layer which adheres thereto and surrounds the undercut metal islands extending above the surface of the oxide layer. In a preferred embodiment lithographic printing plates are prepared by applying a photosentitive layer to the oxide layer which surrounds the undercut metal islands.

Suitable photosensitive or radiation sensitive material that can be used in preparing lithographic printing plates according to the invention include dichromated colloids, photopolymers, such as diazo resins and the like. These and other photochemical materials are described in detail in a text offered by Kosar entitled *Light-sensitive Systems*, John Wiley and Sons, Inc,. New York (1965).

Suitable coating material for forming a coated article according to the invention include organic and inorganic materials. Suitable organic materials include polymers and rubbers such as polyethylene, polypropylene, Teflon, Latex and the like. These materials can be applied to the discontinuously electroplated surface using conventional film coating techniques such as extrusion coating, dispersion and emulsion coating and the like.

Other coating materials can be spray coated onto the discontinuously electroplated surface in particulate form and then fused in place at temperatures lower than the softening or melting temperature of the electroplated substrate itself. Materials that can be applied in this fashion include nylon, Teflon and other sinterable organic materials and inorganic materials such as glasses, oxides and ceramic frits.

It is also possible to form a coated article by electric plating a different metal onto the discontinuously electroplated surface (for example lead or tin can be electroplated onto a discontinuously electroplated chrome surface according to the invention) to fill the areas between the discrete metal islands forming a continuous metal surface. If desired, the electroplated metal applied to the discontinuously electroplated surface of the invention can be fused or melted in place in a finishing operation.

The article of the invention can also serve as a composite catalyst body by utilizing catalytically active metals in the electro deposition step. Such catalytically active metals include iron, cobalt, nickel, palladium, platinum, ruthenium, rhodium, manganese, chromium, copper, molybdenum, tungsten, the rare earth and noble metals and the like. The aluminum substrate can be preformed into rolled or honeycomb configurations and the oxide layer and discontinuous electroplated layer can be formed subsequently. Such catalyst bodies can be used in a host of catalytic applications for example, in automotive air pollution devices and the like. It is particularly advantageous to prepare an aluminum substrate with gamma aluminum oxide as the anodic oxide layer. This form of alumina is catalytically active by itself in automotive anti-pollution devices and contributes to the catalytic action of a composite catalyst body incorporating metal islands of a catalytically active metal as described above.

The present invention can also be used to advantage in the field of electroless plating whereby metallic finishes are applied to non-conducting substrates such as plastics. The improvement in electroless plating according to the present invention involves laminating or otherwise adherring a non-conductive layer such as a phenolic resin, an epoxy resin, ABS, polyethylene, polypropylene, nylon, and the like to an aluminum article produced according to the invention such that the non-conductive material surrounds the undercut metal islands extending above the surface of the oxide layer. The aluminum substrate and the anodic oxide layer are then removed, for example, by chemical etching, leaving behind the discrete individual metal islands imbedded in the surface portion of the non-conductive material. from imbedded islands can then serve as nucleating sites for subsequent electroless depositions of metal coatings using conventional electroless plating techniques. Once an electroless metal finish is applied it is possible to apply further metal finishes using conventional electroplating techniques.

The foregoing would be in lieu of current practices in electroless plating involving etching the plastic surface to provide anchoring site for nucleating agents or pressing a plastic surface against an unsealed anodized aluminum surface followed by etching the aluminum away, leaving a mirror image of the anodized surface in the surface of the plastic, again providing a roughened surface for anchoring nucleating agents. However, the metal islands imbedded in the surface of the non-conductive material can also be removed leaving undercut pores or openings in the non-conductive layer which can then be used as sites for depositing nucleating agents for depositing an electroless metal layer. In this embodiment the undercut pore remaining after the imbedded islands are removed provides an improved anchoring site for nucleating agents and subsequent deposited electroless metal coatings.

The following examples are intended to further illustrate the present invention without limiting same in any manner.

Chromium and copper was electroplated onto an anodized aluminum surface forming a discontinuous electroplated surface thereon composed of discrete metal islands having a bulbous undercut configuration as illustrated in FIGS. 1–12. Cleaned aluminum plaques were anodized in an electrolyte containing 280 grams of sulfuric acid per liter of water. Anodizing was carried out at a temperature of 40° C with a current density of 30 amps per square foot for a period of approximately 54 seconds.

Following the formation of the anodic oxide layer, chromium plating was carried out in an electrolyte containing 250 grams of chromic acid per liter of water and 2.5 grams of sulfuric acid per liter of water. Plating was carried out at a temperature of 40°–45° C for plating times between 60 and 120 seconds at a current density of 125 amps per square foot. The results are shown in FIGS. 1–6 of the drawing.

Cooper plating is carried out in a similar fashion and the results are shown in FIGS. 7–12 of the drawing.

In a further embodiment the present invention makes it possible to continuously anodize and plate aluminum web with either a discontinuous plated metal surface as described herein or, if desired, with a continuous electroplated coating. The process for accomplishing this involves continuously electrolytically anodizing aluminum web in an anodizing cell having therein a cathode connected to a source of direct current and a contact roll connected to the same source of current which precedes the anodizing cell and makes electrical contact with the aluminum web before it enters the anodizing cell proper. Thereafter, the anodized web is plated by electrolytically depositing a platable metal in a plating cell having therein a platable metal anode connected to a second source of direct current and a contact roll connected to the same second source of current and following the plating cell so as to contact the plated aluminum web after it leaves the plating cell.

This embodiment is illustrated in FIG. 14c of the drawing and as noted previously, it is necessary to start up the process by first threading bare aluminum web through the anodizing and plating cells so as to contact the contact roll preceding the anodizing cell and the contact roll following the plating cell. Plating current is switched on in the plating cell which results in some plating on the bare aluminum web. As anodizing in the anodizing cell proceeds, the web entering the plating bath is already anodized and is then plated with a discontinuous or continuous plated metal surface.

Apparatus for continuously treating aluminum web via the embodiment illustrated in FIG. 14c includes an anodizing cell means for continuously electrolytically anodizing aluminum web having therein a cathode connected to a source of current and a contact roll preceding the anodizing cell connected to the same source of current, and plating cell means for continuously electrolytically depositing a platable metal onto the anodized aluminum web having therein a platable metal anode connected to a second source of current and a contact roll following the plating cell means connected to the second source of current.

It is also possible to anodize continuously with single or multi-phase alternating current and subsequently continuously plate with direct current. When alternating current is utilized for continuously anodizing, the web in the anodizing cell is bi-polar and the electrodes in the cell are opposite in polarity with respect to each other and the web.

What is claimed is:

1. Process for electroless plating metals onto a non-conductive substrate which comprises laminating a non-conductive layer to an aluminum article having an aluminum substrate, a porous anodic oxide layer on the substrate and electrolytically deposited, randomly distributed discrete metal islands having a root portion anchored in one or more pores of the oxide layer, said islands extending from the root portion above the surface of the oxide layer thereby forming a composite anodized and discontinuously electroplated surface, such that said non-conductive material surrounds said metal islands extending above the surface of the oxide layer, thereafter removing the aluminum substrate and the anodic oxide layer thereon leaving behind said discrete metal islands imbedded in the non-conductive material, said imbedded metal islands being adapted to serve as nucleating sites for a subsequent electroless deposition of metal coatings.

2. Process of claim 1 wherein said metal islands are also removed leaving undercut pores in said non-conductive layer which are adapted to serve as sites for the deposition of nucleating agents.

3. An electroless plated article produced by the process of claim 1.

4. Process for making a lithographic printing plate which comprises:
   a. electrolytically anodizing an aluminum substrate to form an unsealed, porous anodic oxide layer thereon;
   b. electrolytically depositing, randomly distributed discrete metal islands having a root portion anchored in one or more pores of the oxide layer, said islands extending from the root portion above the surface of the oxide layer forming a composite anodized and discontinuously electroplated surface; and
   c. applying a layer of photosensitive material to said anodized and electroplated surface.

5. Process of claim 4 carried out continuously wherein said aluminum substrate is in the form of a web.

6. Process of claim 5 wherein said aluminum web is anodized in an anodizing cell, said web being in contact with an electrically conductive roll prior to entering said anodizing cell; said anodized web thereafter passing into a plating cell wherein said web is in contact with an electrically conductive roll after leaving said plating cell.

7. Process of claim 5 wherein said aluminum web is anodized by being passed through first a contact cell followed by an anodizing cell and is thereafter passed through a plating cell wherein said web is in contact with an electrically conductive roll after it leaves said plating cell.

8. Process of claim 5 wherein said aluminum web is anodized by introducing anodizing direct current into the aluminum in a cathodic contact cell, said aluminum having an anodized oxide coating formed thereon before entering said cell, said anodized web then passing through a plating bath and contacting an electrically conductive roll after leaving said plating bath.

9. Process of claim 8 wherein said contact cell and said plating bath are combined into the same cell.

10. Process of claim 4 wherein the portions of said oxide layer remaining after said electrolytic deposition are sealed.

11. Process for making coated articles which comprises:
   a. electrolytically anodizing an aluminum substrate to form an unsealed, porous anodic oxide layer thereon;
   b. electrolytically depositing, randomly distributed discrete metal islands having a root portion anchored in one or more pores of the oxide layer, said islands extending from the root portion above the surface of the oxide layer forming a composite anodized and discontinuously electroplated surface; and c. applying a coating to said anodizing and electroplated surface.

12. Process of claim 11 carried out continuously wherein said aluminum substrate is in the form of a web.

13. Process of claim 12 wherein said aluminum web is anodized in an anodizing cell, said web being in contact with an electrically conductive roll prior to entering said anodizing cell; said anodized web thereafter passing into a plating cell wherein said web is in contact with an electrically conductive roll after leaving said plating cell.

14. Process of claim 12 wherein said aluminum web is anodized by being passed through first a contact cell followed by an anodizing cell and is thereafter passed through a plating cell wherein said web is in contact with an electrically conductive roll after it leaves said plating cell.

15. Process of claim 12 wherein said aluminum web is anodized by introducing anodizing direct current into the aluminum in a cathodic contact cell, said aluminum having an anodized oxide coating formed thereon before entering said cell, said anodized web then passing through a plating bath and contacting an electrically conductive roll after leaving said plating bath.

16. Process of claim 15 wherein said contact cell and said plating bath are combined into the same cell.

17. Process of claim 11 wherein the portions of said oxide layer remaining after said electrolytic deposition are sealed.

18. Process for carrying out a catalytic reaction which comprises carrying out the reaction in the presence of a composite catalyst body having an aluminum substrate, an unsealed, porous anodic oxide layer thereon and electrolytically deposited, randomly distributed discrete metal islands of a catalytically active metal having a root portion anchored in one or more pores of the oxide layer, said islands extending from the root portion above the surface of the oxide layer.

19. Process of claim 18 wherein the portions of said oxide layer of the catalyst body remaining after electrolytic deposition of said metal islands are sealed.

20. Process of claim 18 wherein the catalytically active metal is a rare earth metal.

21. Process of claim 18 wherein the catalytically active metal is a noble metal.

22. Process of claim 18 wherein the porous anodic oxide layer is gamma aluminum oxide.

* * * * *

UNITED STATES PATENT OFFICE
CERTIFICATE OF CORRECTION

Patent No. 4,021,592            Dated May 3, 1977

Inventor(s) Howard A. Fromson

It is certified that error appears in the above-identified patent and that said Letters Patent are hereby corrected as shown below:

```
Col. 1, line 24, "wall" should be -- well --.
Col. 2, line 31, "Fig." should be -- Figs. --.
Col. 2, line 35, "Fig." should be -- Figs. --.
Col. 2, line 43, "Fig." should be -- Figs. --.
Col. 2, line 52, "6" should be -- 16 --.
Col. 3, line 28, "briding" should be -- bridging --.
Col. 4, line 2 , "froam" should be -- from --.

Col. 6, line 33, "from" should be -- These --.

Col. 7, line 9 , "Cooper" should be -- Copper --.
```

Signed and Sealed this thirtieth Day of August 1977

[SEAL]

Attest:

RUTH C. MASON
*Attesting Officer*

C. MARSHALL DANN
*Commissioner of Patents and Trademarks*